United States Patent
Nielsen et al.

(10) Patent No.: US 10,156,623 B2
(45) Date of Patent: Dec. 18, 2018

(54) MAGNETIC RESONANCE IMAGING SYSTEM WITH NAVIGATOR-BASED MOTION DETECTION

(71) Applicant: KONINKLIJKE PHILIPS N.V., Eindhoven (NL)

(72) Inventors: Tim Nielsen, Hamburg (DE); Peter Börnert, Hamburg (DE)

(73) Assignee: KONINKLIKE PHILIPS N.V., Eindhoven (NL)

(*) Notice: Subject to any disclaimer, the term of this patent is extended or adjusted under 35 U.S.C. 154(b) by 59 days.

(21) Appl. No.: 14/425,669

(22) PCT Filed: Sep. 2, 2013

(86) PCT No.: PCT/IB2013/058224
§ 371 (c)(1),
(2) Date: Mar. 4, 2015

(87) PCT Pub. No.: WO2014/037868
PCT Pub. Date: Mar. 13, 2014

(65) Prior Publication Data
US 2015/0212182 A1 Jul. 30, 2015

Related U.S. Application Data

(60) Provisional application No. 61/697,451, filed on Sep. 6, 2012.

(51) Int. Cl.
*H03F 1/26* (2006.01)
*G01R 33/565* (2006.01)

(52) U.S. Cl.
CPC .............. *G01R 33/56509* (2013.01)

(58) Field of Classification Search
CPC .......... A61N 2005/1055; A61N 5/1049; G01R 33/56509
(Continued)

(56) References Cited

U.S. PATENT DOCUMENTS 5,311,131 A * 5/1994 Smith .................... G01R 33/58
324/309
5,502,385 A 3/1996 Kuhn et al.
(Continued)

FOREIGN PATENT DOCUMENTS

JP 2008154887 A 7/2008
JP 2009005789 A 1/2009
(Continued)

OTHER PUBLICATIONS

Nielsen, Tim et al "Iterative Motion Compensated Reconstruction for Parallel Imaging using an Orbital Navigator", Magnetic Resonance in Medicine, vol. 66, No. 5, Nov. 2011, pp. 1339-1345.

*Primary Examiner* — Stephanie Bloss

(57) ABSTRACT

A magnetic resonance imaging system (200, 300) acquires magnetic resonance data (242, 244). A processor (230) controls the magnetic resonance imaging system to execute instructions (250, 252, 254, 256, 258) which cause the processor to repeatedly: control (100) the magnetic resonance imaging system to acquire magnetic resonance data including magnetic resonance navigator data (244); create (102) a set of navigator vectors by extracting the navigator data from each portion of the magnetic resonance data; construct (104) a dissimilarity matrix (246, 400, 700, 800, 900, 1000, 1100, 1400, 1500) by calculating a metric between each of the set of navigator vectors; generate (106) a matrix classification (248) of the dissimilarity matrix using a classification algorithm; and control (108) the magnetic resonance imaging system to modify acquisition of the magnetic resonance data using the matrix classification.

19 Claims, 12 Drawing Sheets

(58) Field of Classification Search
USPC .......................................... 324/309; 702/191
See application file for complete search history.

(56) References Cited

U.S. PATENT DOCUMENTS

| | | |
|---|---|---|
| 5,636,636 A | 6/1997 | Kuhn et al. |
| 6,326,786 B1 | 12/2001 | Pruessmann et al. |
| 2002/0107441 A1 | 8/2002 | Kirsch |
| 2002/0180436 A1* | 12/2002 | Dale ................ G01R 33/56509 |
| | | 324/307 |
| 2006/0244445 A1 | 11/2006 | Sussman |
| 2007/0236217 A1* | 10/2007 | Porter ................ G01R 33/5615 |
| | | 324/307 |
| 2011/0074411 A1 | 3/2011 | Tomoda |
| 2011/0116683 A1 | 5/2011 | Kramer et al. |
| 2013/0278263 A1 | 10/2013 | Huang et al. |

FOREIGN PATENT DOCUMENTS

| | | |
|---|---|---|
| JP | 2009106573 A | 5/2009 |
| JP | 5699740 B2 | 4/2015 |
| RU | 2103916 C1 | 2/1998 |

\* cited by examiner

US 10,156,623 B2

MAGNETIC RESONANCE IMAGING SYSTEM WITH NAVIGATOR-BASED MOTION DETECTION

CROSS-REFERENCE TO PRIOR APPLICATIONS

This application is the U.S. National Phase application under 35 U.S.C. § 371 of International Application No. PCT/IB2013/058224, filed on Sep. 2, 2013, which claims the benefit of U.S. Provisional Patent Application No. 61/697,451, filed on Sep. 2, 2012. These applications are hereby incorporated by reference herein.

TECHNICAL FIELD

The invention relates to magnetic resonance imaging, in particular to the modification of the acquisition of magnetic resonance imaging using a dissimilarity matrix classification.

BACKGROUND OF THE INVENTION

Patient motion during magnetic resonance imaging (MRI) data acquisition can lead to image artifacts which compromise the diagnostic quality of the resulting images. This is an important problem and has lead to a large number of methods which aim at reducing the impact of patient motion. Despite these past efforts, patient motion is still an important problem today; partly because increased SNR and fast scan methods of modern magnetic resonance (MR) scanners allow imaging at higher spatial resolution which makes the experiment more sensitive to motion, partly because the proposed methods are impractical in routine clinical use. This can be the case either because they require sensors which are too complicated and/or time consuming to connect, or because they prolong the scan duration excessively. Other common limitations are restriction to certain anatomies/imaging sequences, negative impact on image contrast etc.

In "The Elements of Statistical Learning: Data Mining, Inference, and Prediction, Second Edition (Springer Series in Statistics)," Chapter 14.3 by Trevor Hastie, Robert Tibshirani, Jerome Friedman methods of cluster analysis are explained.

SUMMARY OF THE INVENTION

The invention provides for a magnetic resonance imaging system and a computer program product in the independent claims. Embodiments are given in the dependent claims.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wireline, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, gear sticks, steering wheel, pedals, wired glove, dance pad, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bistable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins by the antenna of a Magnetic resonance apparatus during a magnetic resonance imaging scan. Magnetic resonance data is an example of medical image data. A Magnetic Resonance Imaging (MRI) image is defined herein as being the reconstructed two or three dimensional visualization of anatomic data contained within the magnetic resonance imaging data. This visualization can be performed using a computer. A portion of magnetic resonance data may also refer to a "shot." Navigator data is an example of magnetic resonance data, and is typically representative of a subject's location or state of motion.

In one aspect the invention provides for a magnetic resonance imaging system for acquiring magnetic resonance data from and imaging zone. The magnetic resonance imaging system comprises a processor for controlling the magnetic resonance imaging system. The magnetic resonance imaging system further comprises a memory for storing machine-executable instructions for execution by the processor. Execution of the machine-executable instructions causes the processor to repeatedly control the magnetic resonance imaging system to acquire a portion of the magnetic resonance data. Each portion of the magnetic resonance data comprises navigator data. For some magnetic resonance imaging protocols the data may be acquired over a period of minutes. The portion of the magnetic resonance data refers to a portion of magnetic resonance data that is acquired during a complete protocol.

Navigator data as used herein encompasses magnetic resonance data that is indicative of motion of a subject. For instance if a subject is completely stationary internally and externally then the navigator data should not change. If however the subject is moving or is moving internally then the navigator data may be useful for representing or quantifying this motion. In some embodiments, the navigator data may be separately acquired navigator data which is acquired in an interleaved fashion with the portion or portions of magnetic resonance data. The navigator data may also be image data and/or data in k-space which is extracted from the portion of the magnetic resonance data. Different types of navigators may be used. For instance, the navigator data may be one-dimensional signals or projections like a central k-space line. A F-navigator (a k-space line parallel to the central k-space line), an O-navigator (a circle around the k-space origin) are examples. Measurements of data in higher dimensions like small images or their subsets may also be used as navigators. Execution of the machine-executable instructions further causes the processor to repeatedly create a set of navigator vectors by extracting the navigator data from each portion of the magnetic resonance data. After each acquisition of the navigator data a navigator vector is constructed and this is then added to a set of navigator vectors.

Execution of the machine-executable instructions further causes the processor to repeatedly construct a dissimilarity matrix, or D-matrix, by calculating a metric between each of the set of navigator vectors. A metric as used herein is a mathematical function which is used to generate a value or values to evaluate the closeness or similarity of two navigator vectors. A dissimilarity matrix as used herein encompasses a matrix used to store the relative dissimilarity as measured by a metric between two or more mathematical objects, such as navigator vectors.

The dissimilarity between each of the navigator vectors is measured using the metric and this is then used to construct the dissimilarity matrix. As more and more navigator data is acquired it may not be necessary to completely reconstruct the dissimilarity matrix every time. For instance when one navigator vector is added the additional data may simply be added to the existing dissimilarity matrix and make it larger. Execution of the instructions further causes the processor to repeatedly generate a matrix classification of the dissimilarity matrix using a classification algorithm. The classification algorithm takes the dissimilarity matrix as input and then outputs a matrix classification. The classification algorithm is therefore able to return a classification which is descriptive of the structure of the values inside the dissimilarity matrix or is able to identify transitions in the value of the set of navigators. Execution of the instructions further causes the processor to control the magnetic resonance imaging system to modify acquisition of the magnetic resonance data using the matrix classification. For instance the matrix classification may indicate that the subject has moved internally or externally since the last data acquisition. This may be used for instance to determine whether the magnetic resonance protocol should be continued or if it should be discontinued. This embodiment may be beneficial because it enables the determination of various types of movement of the subject internally or externally. This may aid in generating magnetic resonance images more rapidly.

In another embodiment the classification algorithm is a pattern recognition algorithm operable for selecting the matrix classification. The pattern recognition algorithm may for instance be programmed or contain instructions which enable the process to identify transitions in the values of the navigator vectors or may be operable for identifying patterns in the set of navigator vectors. For instance a neural network may be programmed to the matrix classification.

In another embodiment the memory further comprises a matrix library comprising example matrices. The pattern recognition module is operable for selecting one of the example matrices. This embodiment may be beneficial because it enables the selection of specific library matrices. This may aid in more rapidly generating the matrix classification.

In another embodiment each of the example matrices is associated with modification instructions. Acquisition of the magnetic resonance data by the magnetic resonance imaging system is modified by executing the modification instructions. This embodiment may be beneficial because it provides a means of modifying the acquisition of the magnetic resonance data on the fly while the acquisition is taking place. The use of a matrix library in this context may be useful because the examples in the matrix library may be well worked out and the modification to improve the data quality may be known.

In another embodiment the pattern recognition algorithm is a cluster analysis algorithm. The cluster analysis algorithm is operable for performing a temporal correlation of the set of navigator vectors. The temporal correlation between the various navigator vectors may then be used to generate the dissimilarity matrix. A cluster analysis algorithm as used herein encompasses an algorithm which may be used for cluster analysis which is also known as data segmentation. This may be particularly beneficial because cluster analysis may be useful for grouping the navigator vectors into different groups. For instance if a subject moved then the cluster analysis algorithm may identify that there are two or more different groups of navigator vectors. By dividing the navigator vectors into such groups it may be easy then to identify when a subject moves. However, in some instances the cluster analysis may indicate that navigator vectors have a higher degree of similarity with a certain period. This for instance may indicate a periodic motion of the subject.

In another embodiment, the clustering algorithm is an agglomerative hierarchical clustering algorithm which uses average linkage. This is an iterative procedure where you begin with clusters which contain only one element (=one navigator shot). This means in the beginning the number of clusters is equal to the number of navigator shots. In each iteration, you the number of clusters is reduced by one by merging the two clusters which are closest to each other.

To use the method you need to define a metric which calculates the distance between two clusters. Again different options exist, but all are based on the dissimilarity matrix values for the elements which belong to the clusters: you can take the minimum, maximum or average of the dissimilarity values of all elements involved.

This gives you a decreasing sequence of clusters with an increasing inter-cluster dissimilarity at which the fusion of two clusters takes place. If you plot the fusion dissimilarity against the number of clusters you will notice strong jumps in this graph if the navigator shots can be separated into distinct groups. By putting a threshold to the maximum acceptable inter-cluster distance you select one particular clustering from the hierarchical chain of clusters.

In another embodiment the classification algorithm is a statistical analysis algorithm. This may be beneficial because there are a variety of well-known statistical techniques which may be used for identifying change in data.

In another embodiment the statistical analysis algorithm is operable to determine matrix classification by performing any one of the following: performing a Bayesian analysis, thresholding the dissimilarity matrix, calculating a standard deviation of the dissimilarity matrix, identifying the elements of the dissimilarity matrix outside of a predetermined range and performing a probability based selection.

In another embodiment the magnetic resonance data comprises multiple slices. Execution of the instructions further causes the processor to calculate a set of dissimilarity matrices using the dissimilarity matrix for each of the multiple slices. Execution of the instructions further causes the processor to generate a set of matrix classifications by using the classification algorithm to generate the dissimilarity matrix for each of the set of dissimilarity matrices. Execution of the instructions further cause the processor to control the magnetic resonance imaging system to modify acquisition of the magnetic resonance data using the set of matrix classifications. When magnetic resonance data is acquired it may be acquired in more than one acquisition plane or slice. A slice as used herein encompasses a two-dimensional region where magnetic resonance data is acquired from. The reference to the two-dimension is in fact a reference to the desired location. The magnetic resonance data is acquired in Fourier space so the acquisition of magnetic resonance data is essentially from a three-dimensional volume. From each particular slice its own dissimilarity matrix may be used. This embodiment may be particularly beneficial because it allows the magnetic resonance protocol to be optimized in each particular slice.

In another embodiment the control magnetic resonance imaging system is performed by applying a rule-based algorithm to the set of matrix classifications.

In another embodiment the magnetic resonance data comprises a set of sample points in k-space. Each portion of the magnetic resonance data is a subset of the set of sample points.

In another embodiment the magnetic resonance imaging system further comprises a multi-channel radio-frequency system operable for receiving the magnetic resonance data from more than one channel simultaneously. Execution of the instructions further causes the processor to create the set of navigator vectors by combining the navigator data from the more than one channel. For instance on each individual data a navigator data may be acquired. The navigator data from each of the channels may be combined using a variety of different techniques. For instance typically in multi-channel radio-frequency systems the data from each of the channels is weighted differently for different geographic locations. This weighting factor between the relative channels may be used to combine the set of navigator vectors. In other embodiments the navigator vectors may simply be averaged. In other embodiments a subset of the navigator data collected from the different radio channels may be selected.

In another embodiment the navigator data is combined by using any one of the following: averaging the navigator data from the more than one channel using a predetermined weight and concatenating the navigator data from the more than one channel. In another embodiment the predetermined weighting factor is any one of the following: Roemer sensitivities, spatial location, or the received signal strength.

Concatenation enables the reduction of a multitude of measurements into a single dissimilarity value. One way to implement this is to define a metric ("d") for each measurement ("$x_{ij}$") and then sum up the values of all metrics applied to their respective measurement. In this case the i indices may refer to different navigator shots and the j indices may refer to different measurement values. These can be different k-space samples of the same receive channel or different receive channels or even different devices (like a respiratory belt).

In another embodiment in the case of multi-channel magnetic resonance acquisitions the navigator signals can be combined to further process using appropriate channel communication which approach is implying certain weighting factors to reduce the numerical effort during evaluation. These weighting factors may be derived from potentially available coil sensitivity information and also from a—priority knowledge to additionally balance the impact of the individual signals of the navigator data. This may be spatial—and confidence-wise. In another embodiment this may include omitting the signal combination processing by designating an appropriate metric that takes the potential multi-channel nature of the magnetic resonance navigator signal during the calculation of the matrix elements into account.

In another embodiment the acquisition of magnetic resonance data is modified by any one of the following: stopping the acquisition of magnetic resonance data, modifying the scan geometry and restraining the acquisition of magnetic resonance data, ignoring one or more points of the magnetic resonance data, reacquiring a portion of the magnetic resonance data, generating an operator alert, and combinations thereof. Depending upon what is determined by the matrix classification, various actions may be necessary for correction the acquisition of the magnetic resonance data.

In another embodiment the metric is any one of the following: computing the sum of the squared complex difference between navigator vectors, calculating the difference in the magnitude of the navigator vectors, calculating the absolute value of the difference between navigator vectors, and calculating the correlation between navigator signals. The metric may also include normalizing the navigator vectors. For example the navigator vectors may be normalized using the minimum value of the D-matrix as part of calculating the metric.

When performing a metric calculation on two navigator vectors a Fourier transformation on the navigator data may be performed in some embodiments as a pre-processing step.

The navigator data may be one-dimensional signals or projections like a central k-space line. A F-navigator (a k-space line parallel to the central k-space line), an O-navigator (a circle around the k-space origin) are examples. Measurements of data in higher dimensions like small images or their subsets may also be used as navigators.

In another embodiment the magnetic resonance data further comprises image data. Execution of the instructions causes the magnetic resonance imaging system to acquire the image data from a first region of interest and acquire the navigator data from a second region of interest. In an alternative embodiment the navigator data is taken from the image data. In some embodiments the navigator could be a magnetic resonance signal that stems from the actual imaging and/or volume or could alternatively originate from a sub-volume that is different from that of the imaging volume.

In another embodiment the magnetic resonance imaging system comprises a motion detection system for generating motion data/navigator-type of data. Execution of the instructions causes the process to acquire the motion data during the acquisition of the magnetic resonance data. Execution of the instructions further causes the processor to incorporate the motion data into the dissimilarity matrix. This embodiment may be beneficial because additional data may be used to combine into the dissimilarity matrix making it more accurate. For example the signal could result from external motion sensing devices such as a pillow, a belt, or a camera that are placed outside of the patient. In some embodiments the navigator's sources could refer to the same motion state and simultaneously be taken into consideration using an appropriate dissimilarity matrix supporting this.

To incorporate different types of data into a single dissimilarity matrix a scaling factor or other function may be used.

Combining navigator data from multiple sources or using a motion detection system such as a respiratory belt data is not a fundamental problem. In practice it can require of course some experimentation to balance the influence of the different measurements against each other (i.e. adjusting the metrics).

The motivation for combining navigator data from different elements is a bit different from concatenation: The effort for the calculation of the dissimilarity matrix scales quadratic with the number of navigator shots. In order to calculate the D matrix value quickly it is advantageous to keep the navigator vector short. This is why it can be useful to combine the navigator vectors into one vector before the dissimilarity is calculated. Even more compression can be applied: e.g. adjacent samples can be averaged, or only every n-th sample is taken into account.

In another aspect the invention provides for a computer program product comprising machine-readable instructions for execution by a processor controlling a magnetic resonance imaging system for acquiring magnetic resonance data from an imaging zone. Execution of the machine-executable instructions causes the processor to repeatedly control the magnetic resonance imaging system to acquire a portion of the magnetic resonance data. Each portion of the magnetic resonance data comprises a navigator data.

Execution of the machine-executable instructions further causes the processor to repeatedly create a set of navigator vectors by extracting the navigator data from each portion of the magnetic resonance data. Execution of the machine-executable instructions further causes the processor to repeatedly generate a matrix classification of the dissimilarity matrix using a classification algorithm. Execution of the machine-executable instructions further causes the processor to repeatedly control the magnetic resonance imaging system to modify acquisition of the magnetic resonance data using the matrix classification.

In another aspect the invention further provides for a method of controlling the magnetic resonance imaging system. The method comprises the step of repeatedly controlling the magnetic resonance imaging system to acquire a portion of the magnetic resonance data. Each portion of the magnetic resonance data comprises navigator data. The method further comprises the step of creating a set of navigator vectors by extracting the navigator data from each portion of the magnetic resonance data. The method further comprises the step of constructing a dissimilarity matrix by calculating a metric between each of the set of navigator vectors. The method further comprises the step of generating a matrix classification of the dissimilarity matrix using a classification algorithm. The method further comprises the step of controlling the magnetic resonance imaging system to modify acquisition of the magnetic resonance data using the matrix classification.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
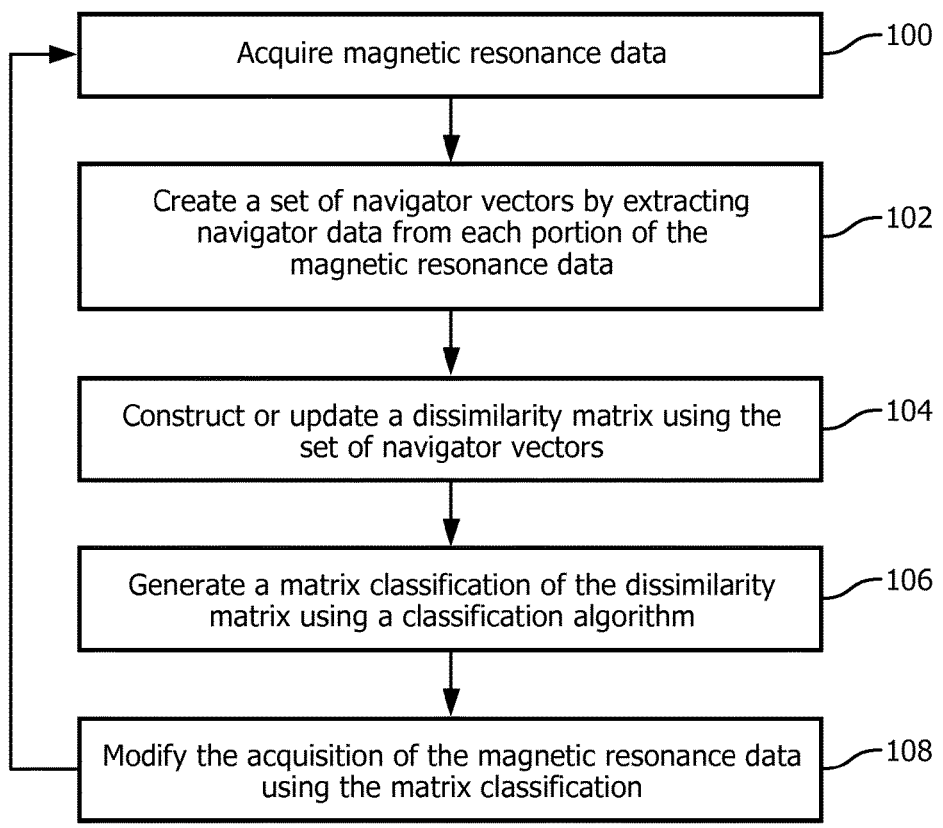
FIG. 1 shows a flow diagram which illustrates a method according to an embodiment of the invention.

FIG. 1 shows a flow diagram which illustrates a method according to an embodiment of the invention. First in step 100 magnetic resonance data is acquired. The magnetic resonance system acquires a portion of the magnetic resonance data. Each portion of the magnetic resonance data comprises navigator data. Next in step 102 a set of navigator vectors are created by extracting navigator data from each portion of the magnetic resonance data. Next in step 104 a dissimilarity matrix is calculated using a metric between each of the set of navigator vectors. As this is an iterative process the dissimilarity matrix may simply be updated from a previous version by adding newly acquired navigator vectors and calculating the dissimilarity between the existing ones. Next in step 106 a matrix classification is generated of the dissimilarity matrix using a classification algorithm. Then in step 108 the acquisition of the magnetic resonance data is modified using the matrix classification. For instance the matrix classification may be associated with a set of commands which are used to modify how the magnetic resonance data is acquired. The method then proceeds to step 100 and the steps are repeated until all of the magnetic resonance data is acquired.

Figure 2:
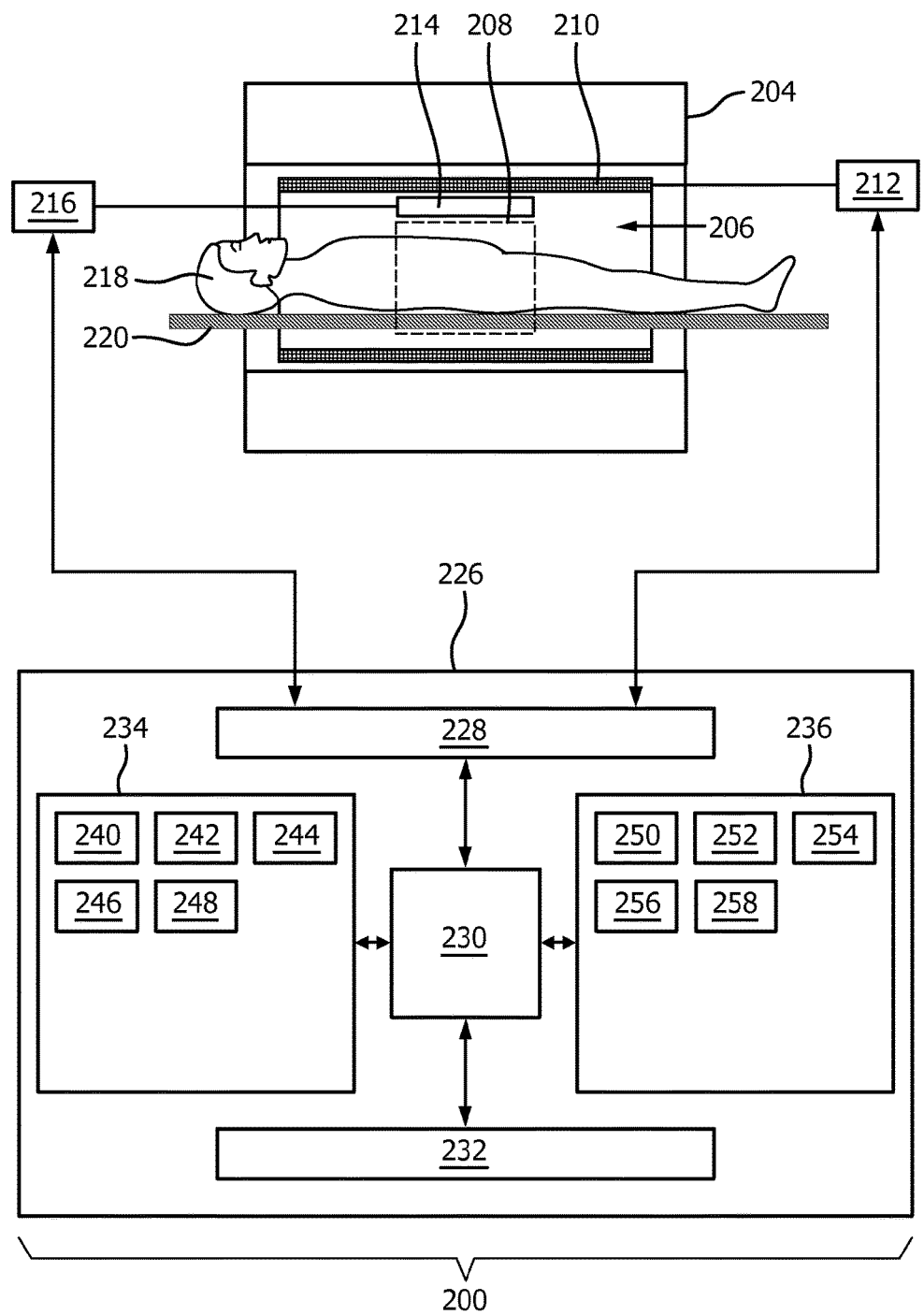
FIG. 2 illustrates an example of a magnetic resonance imaging system according to an embodiment of the invention.

FIG. 2 illustrates an example of a magnetic resonance imaging system 200 according to an embodiment of the invention. The magnetic resonance imaging system 200 comprises a magnet 204. The magnet 200 is a superconducting cylindrical type magnet 200 with a bore 206 through it. The use of different types of magnets is also possible for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 206 of the cylindrical magnet 204 there is an imaging zone 208 where the magnetic field is strong and uniform enough to perform magnetic resonance imaging.

Within the bore 206 of the magnet there is also a set of magnetic field gradient coils 210 which is used for acquisition of magnetic resonance data to spatially encode magnetic spins within the imaging zone 208 of the magnet 204. The magnetic field gradient coils 210 connected to a magnetic field gradient coil power supply 212. The magnetic field gradient coils 210 are intended to be representative. Typically magnetic field gradient coils 210 contain three separate sets of coils for spatially encoding in three orthogonal spatial directions. A magnetic field gradient power supply supplies current to the magnetic field gradient coils. The current supplied to the magnetic field gradient coils 210 is controlled as a function of time and may be ramped or pulsed.

Adjacent to the imaging zone 208 is a radio-frequency coil 214 for manipulating the orientations of magnetic spins within the imaging zone 208 and for receiving radio transmissions from spins also within the imaging zone 208. The radio frequency antenna may contain multiple coil elements. The radio frequency antenna may also be referred to as a channel or antenna. The radio-frequency coil 214 is connected to a radio frequency transceiver 216. The radio-frequency coil 214 and radio frequency transceiver 216 may be replaced by separate transmit and receive coils and a separate transmitter and receiver. It is understood that the radio-frequency coil 214 and the radio frequency transceiver 216 are representative. The radio-frequency coil 214 is intended to also represent a dedicated transmit antenna and a dedicated receive antenna. Likewise the transceiver 216 may also represent a separate transmitter and receivers. The radio-frequency coil 214 may also have multiple receive/transmit elements and the radio frequency transceiver 216 may have multiple receive/transmit channels.

The magnetic field gradient coil power supply 212 and the transceiver 216 are connected to a hardware interface 228 of computer system 226. The computer system 226 further comprises a processor 230. The processor 230 is connected to the hardware interface 228, a user interface 232, computer storage 234, and computer memory 236.

The computer memory 236 is shown as containing a control module 250. The control module 250 contains computer-executable code which enables the processor 230 to control the operation and function of the magnetic resonance imaging system 200. For instance the control module 250 may use the pulse sequence 240 to acquire the magnetic resonance data 242. The computer memory 236 is further shown as containing navigator data extraction module 252. The navigator data extraction module 252 contains computer-executable code which enables the processor to extract the navigator data 244 from the magnetic resonance data 242. The exact implementation of the module 252 may depend upon the nature of the navigator data 244. For instance the module 252 may extract a portion of the k-space data from the magnetic resonance data 242. The computer memory 236 is shown as further containing a dissimilarity matrix generation module 254. The module 254 contains computer-executable code which enables the processor 230 to generate the dissimilarity matrix 246 using the navigator data 244. The computer memory 236 is further shown as containing a matrix classification module 256. The matrix classification module 256 contains computer-executable code which enables the processor 230 to generate the matrix classification 248 using the dissimilarity matrix 246. The computer memory 236 is further shown as containing a pulse sequence modification module 258. The pulse sequence modification module 258 contains computer-executable code which enables the processor 230 to modify the pulse sequence 240. Modification of the pulse sequence may or may not mean modifying the individual commands executed as specified by the pulse sequence 240. For instance the pulse sequence modification module 258 may simply have a portion of the data be reacquired.

Figure 3:
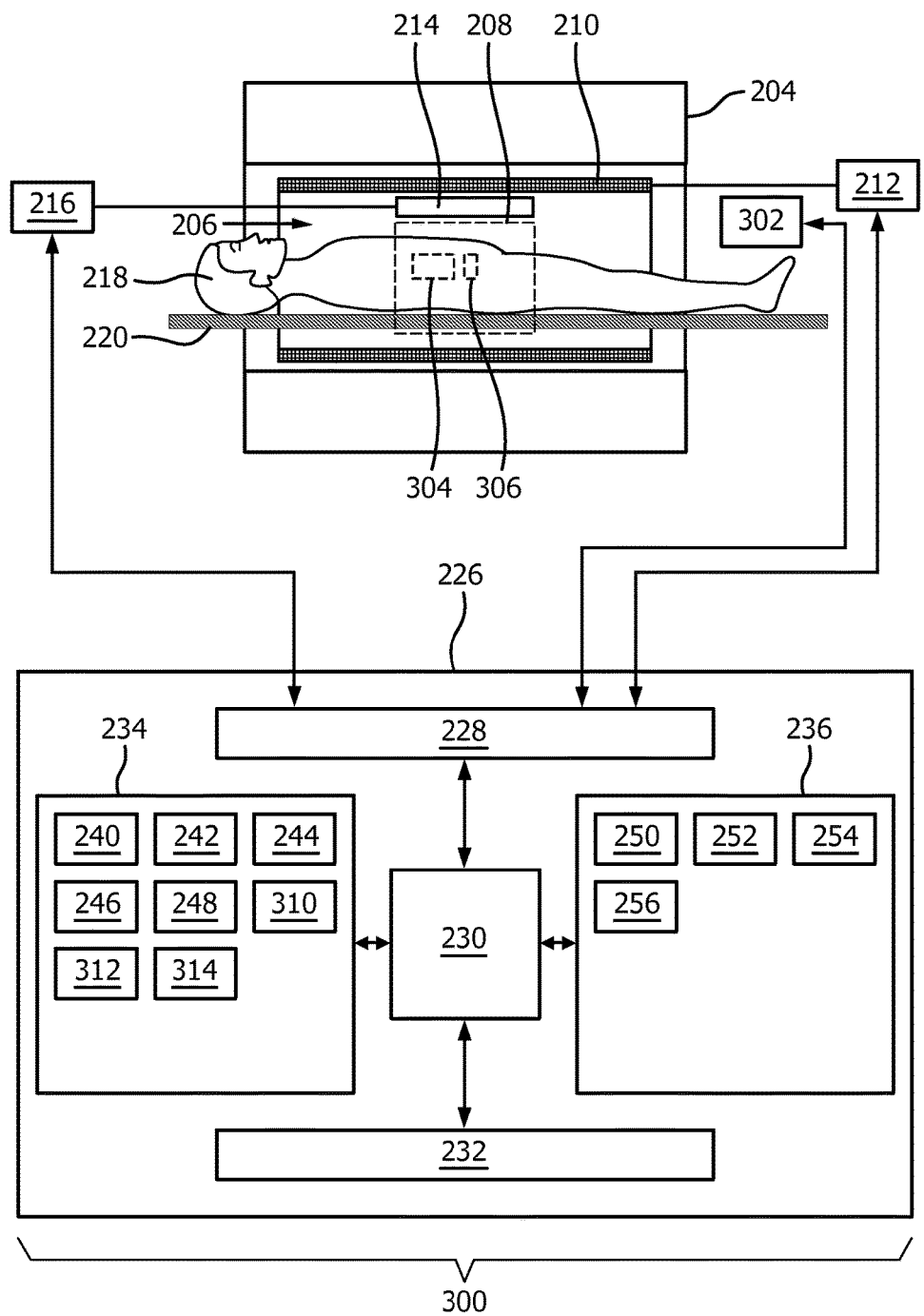
FIG. 3 shows a magnetic resonance imaging system according to a further embodiment of the invention.

FIG. 3 shows a magnetic resonance imaging system 300 similar to that shown in FIG. 2. In this embodiment there is an additional motion detection system 302. The motion detection system 302 is intended to be representative of any system which may be capable of detecting the motion of the subject 218. 302 may for instance be a camera, a sensor, an accelerometer, or other type of motion detection system. Within the imaging zone 208 is shown a first region of interest 304 where the magnetic resonance data 242 was acquired from. Also shown within the imaging zone 208 is a second region of interest 306. The navigator data 244 is acquired from the second region of interest 306. In some embodiments the second region of interest 306 is at least partially within the first region of interest 304. It should be noted that the magnetic resonance data navigator data is acquired in Fourier space. As such the magnetic resonance data and the Fourier data are at least partially acquired outside of the first region of interest 304 and the second region of interest 306.

The computer storage 234 is further shown as containing a matrix library 310. The matrix library contains a selection of example matrices which the dissimilarity matrix 246 can be compared against by the matrix classification module 256. A matrix from the library 310 is selected as best matching the dissimilarity matrix 246. In this embodiment there is a modification instruction 312 that is associated with the matrix classification 248. The modification instruction 312 is then used by the control module 250 to modify the pulse sequence 240. The computer storage 234 is further shown as containing motion data 314 that was acquired using the motion detection system 302. The dissimilarity matrix generation module 254 in this embodiment is operable for causing the processor to incorporate the motion data 314 into the dissimilarity matrix 246.

Embodiments of the invention may provide for a general method to characterize patient motion in real-time based on navigator signals. In particular it may solve the following problems:

1. It enables a differentiation between multiple different motion types. For instance, between periodic motion, like regular breathing motion for example, sudden, incidental patient motion, like coughing, and irreversible motion that substantially changes the position of the patient. Being able to make this distinction is important because it can be used to predict success or failure of continuing data acquisition, and might be helpful to trigger appropriate decisions how to proceed with the scan.

2. It may analyze motion during the actual data acquisition period and does not require calibration. In particular, it does not rely on assumptions made in other motion correction techniques such as:
    the motion during the scan is the same as during a navigator "training phase" prior to the scan
    there is a "mean state" which can be used as reference in the motion analysis
    motion below a certain threshold is tolerable whereas motion above the threshold is not.
Experience has shown that relying on any of these assumptions has limitations.

3. It can be used to predict how useful appropriate reacquisition of data is to reduce/avoid motion artifacts.

4. The method is fast. It can be executed during the measurement and can be used to control data acquisition in real-time, helping to decide which part of the data should be re-acquired to further improve data consistency and image quality.

5. No planning of the navigator is required and it can work together with numerous motion sensing approaches.

Embodiments of the invention may have the features of:

1. Computing a "dissimilarity matrix" (or short: D matrix) from navigator data which are acquired in addition to the normal imaging data.

2. Characterizing motion by a quantitative analysis of the D matrix. This is possible because different types of motion lead to characteristic patterns in the D matrix. Moreover, the strength of the pattern reflects the strength of the motion, so that the quantitative conclusion from the evaluation of the matrix can be drawn.

In order to implement embodiments navigator data may be acquired in addition to the normal imaging data. The basic feature that a signal must have in order to qualify as navigator is that it should be reproducible in the absence of motion.

Many options exist to achieve this goal, e.g.:
    add one echo to a TSE or TFE acquisition to acquire a classical navigator, or floating navigator, or orbital navigator.
    use the FID as navigator
    Navigators can also be interleaved into FFE sequences.
    Form a navigator as an element of an appropriate magnetization preparation scheme preceding or following a data acquisition sequence.

The calculation of the dissimilarity matrix is discussed next. One element of the dissimilarity matrix $D_{ij}$ is computed from the navigator data by comparing navigator data i with navigator data j, e.g. by computing the sum of the squared complex difference of all navigator samples. This example is only exemplary, there are also alternative ways to compute $D_{ij}$. If N navigators were acquired during data acquisition this results in an N×N matrix.

Once the dissimilarity matrix has been calculated, different motion types produce different patterns on the D matrix. This will be shown below by a few examples from volunteer experiments. Analyzing these patterns allows deciding if reacquisition of certain data can prevent image artifacts due to motion.

Figure 4:
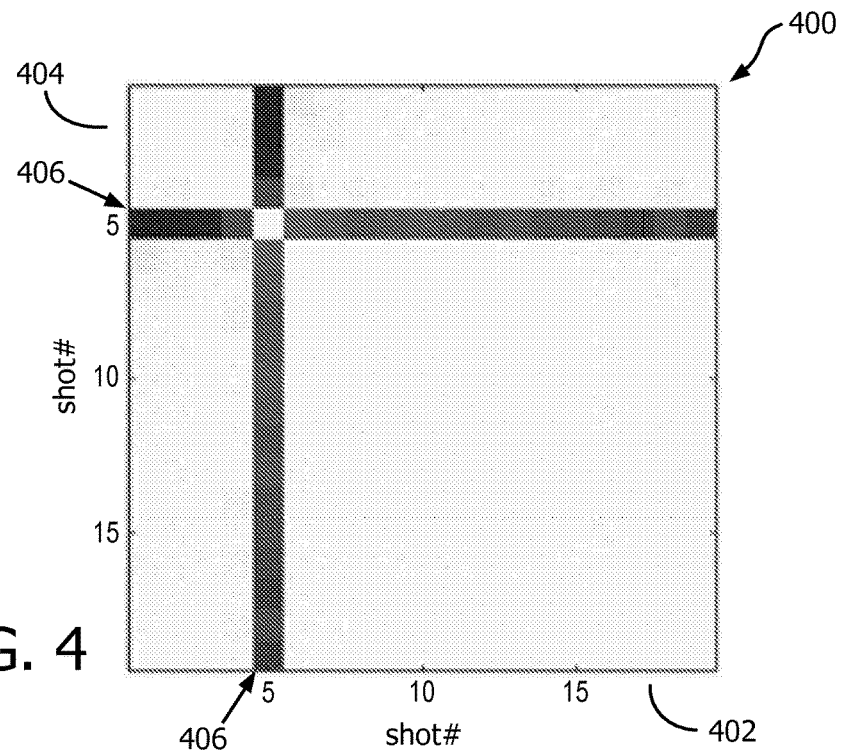
FIG. 4 shows a visualization of a dissimilarity matrix from an example from T2 weighted head imaging.

FIGS. 4-through 11, 14, and 15 illustrate visualizations of similarity matrices. In these examples the fading of the squares is used to indicate the dissimilarity. If the square if perfectly white then there is low dissimilarity. If the square is darker then there is high dissimilarity. All examples are from multi-slice, multi-shot TSE sequences where an orbital navigator was added to the echo train. The D matrix is displayed in gray scale where a dark value represents a large dissimilarity and white represents a low dissimilarity.

First, the detection of reversible incidental motion is illustrated. FIG. 4 shows a visualization of a dissimilarity matrix 400 from an example from T2 weighted head imaging. The x-axis is labeled 402 and the y-axis is labeled 404. Both the x-axis and the y-axis indicate the shot number. A shot as used herein is understood to be equivalent with a portion of the magnetic resonance data. Most of the D matrix is white which indicates low dissimilarity. The majority of navigator and most TSE shots agree well with one another. An exception is shot number 5, 406, which is different from all the other shots. In this experiment, the volunteer briefly scratched the forehead during the data acquisition causing shot number 5, 406, to be disturbed. Image artifacts are resulting from this disturbance. If shot number 5, 406, is replaced by reacquired data, the artifacts disappear. Other examples for this type of motion are coughing and swallowing.

Figure 5:
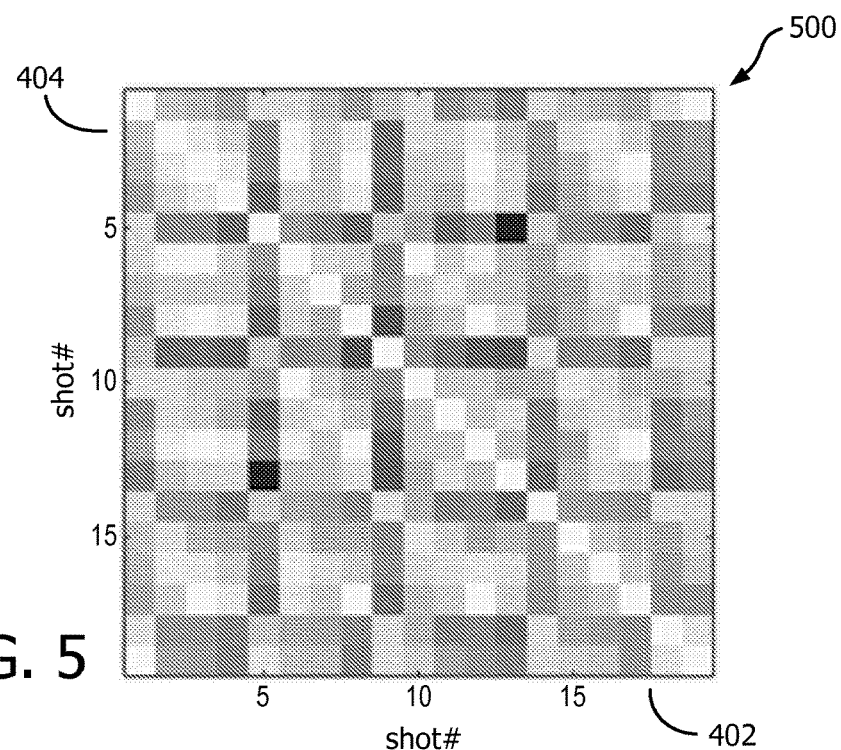
FIG. 5 shows a further visualization of a dissimilarity matrix 500 also from T2 weighted head imaging.

Next, the detection of periodic motion is illustrated. FIG. 5 shows another visualization of a dissimilarity matrix 500. This example is also from T2 weighted head imaging. Here, the D matrix can be separated into two groups where the shots within one group agree well to another but not to the shots of the other group: group 1=1, 5, 9, 14, 18, 19; group 2=2, 3, 4, 6, 7, 8, 10, 11, 12, 13, 15, 16, 17. This results in a checkerboard-like pattern. In this case, the motion was pulsation of the blood vessels. The regular pattern is caused by beating of the heart frequency and the navigator frequency (fixed by the sequence TR).

Reacquisition of the shots in group 1 can reduce pulsation artifacts in the image. Similar patterns might result from an appropriate superposition of different in partly periodic motion sources like respiration and cardiac motion.

Figure 6:
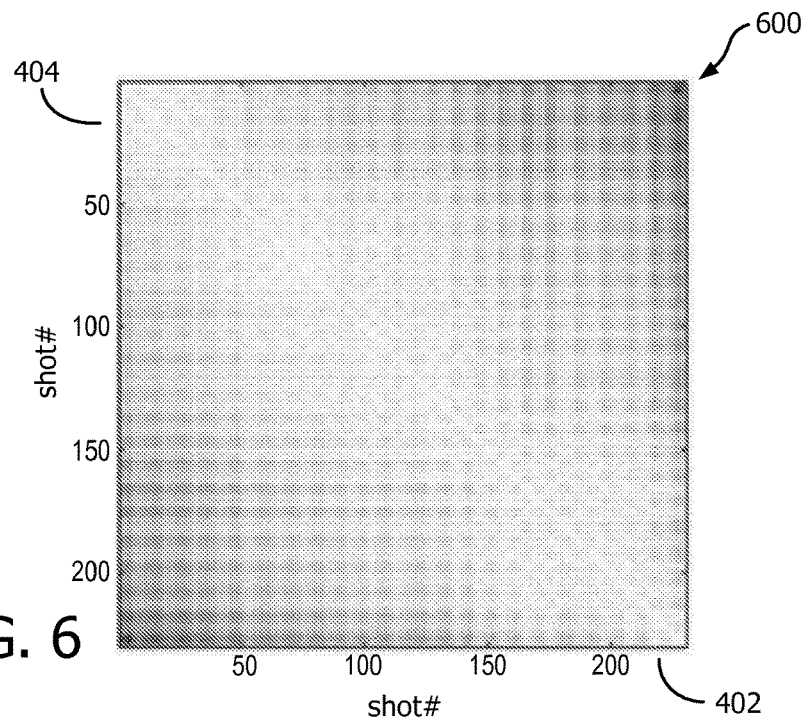
FIG. 6 shows a further visualization of a dissimilarity matrix which was constructed during T1 weighted shoulder imaging and also illustrates periodic motion.

FIG. 6 shows a further visualization of a dissimilarity matrix 600 which was constructed during T1 weighted shoulder imaging and also illustrates periodic motion. It shows a fairly regular checkerboard pattern which is induced by breathing motion. Superimposed on the checkerboard is an increasing dissimilarity towards the top right and bottom left corner of the D matrix (=increasing time between navigators). This is caused by drift.

This is also a first example for the ability of the D matrix to distinguish different motion types, in this case drift and periodic motion. Based on these D matrix data it one is able to make a decision whether a re-acquisition will make sense to potentially improve data consistency an image quality.

Figure 7:
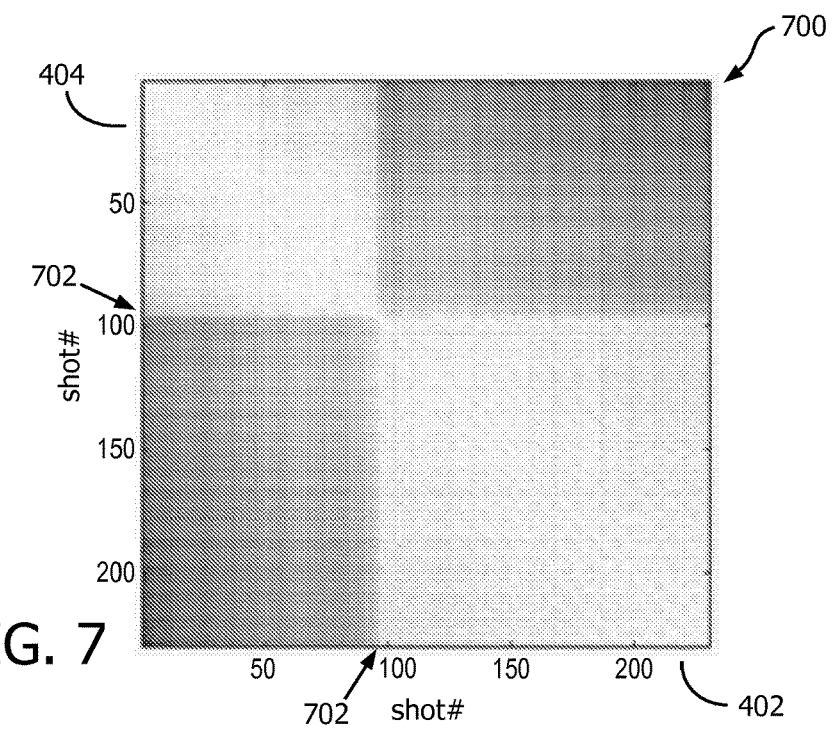
FIG. 7 shows a further example of a dissimilarity matrix that was acquired during T1 weighted shoulder imaging.

Next, the detection of sudden irreversible changes is illustrated. FIG. 7 shows a further example of a dissimilarity matrix that was acquired during T1 weighted shoulder imaging. An abrupt change in the dissimilarity matrix is shown around shot number 95, labeled 702, where a sudden irreversible change occurs. All data from the start of the scan until this event agrees well with another but do not match to anything that comes after this event. All data measured after shot #95 agree well among each other and do not match the first part of the scan. This is a case where reacquiring a few shots will not prevent artifacts. Instead all shots numbers 1 through 95 are preferably repeated.

It should be noted, that the D matrix also contains weakly the checkerboard-like breathing motion pattern. But its strength is insignificant compared to the sudden irreversible motion.

Figure 8:
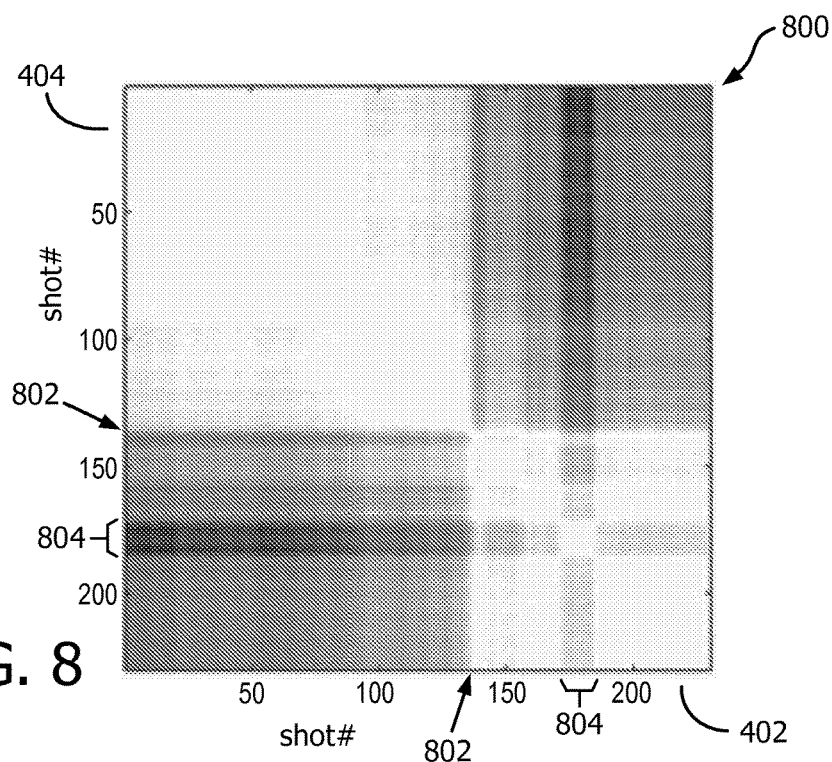
FIG. 8 shows a further visualization of a dissimilarity matrix which illustrates sudden irreversible motion during T1 weighted shoulder imaging.

Next, the detection of a combination of reversible and irreversible motion is illustrated. FIG. 8 shows a further visualization of a dissimilarity matrix 800. In this example (T1w shoulder imaging) shows a sudden irreversible motion at shot number 130, 802, and a short time period of reversible motion around numbers 170-180, labeled 804. In addition, there is a weak regular checker-board pattern due to breathing present for the entire scan.

Figure 9:
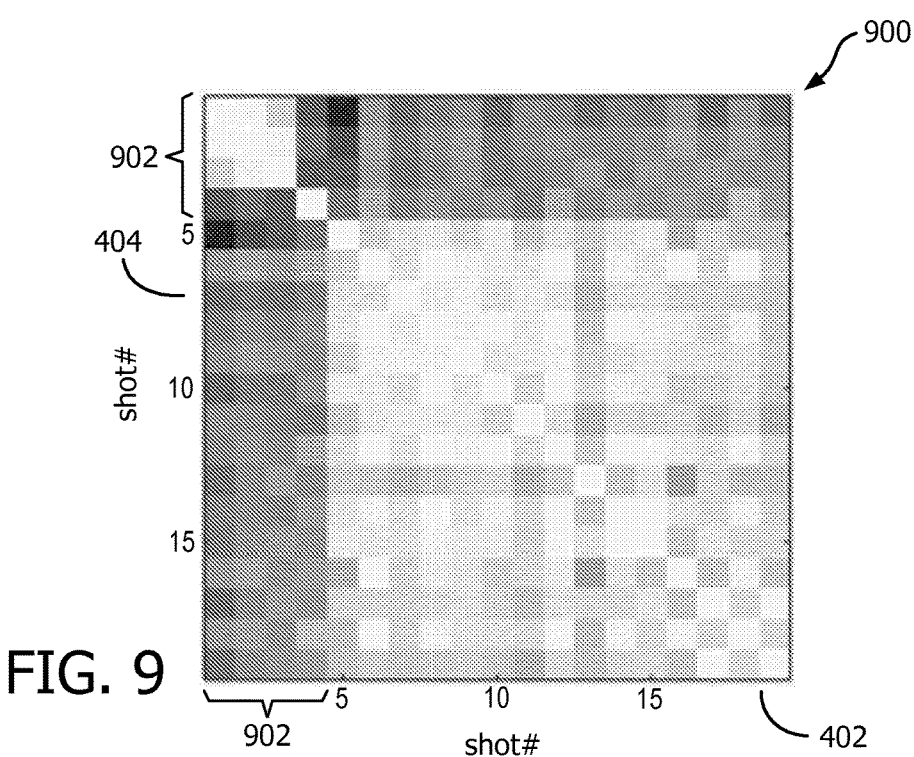
FIG. 9 shows a further visualization of a dissimilarity matrix which illustrates how image quality may be improved by analyzing a dissimilarity matrix.

FIG. 9 shows a further visualization of a dissimilarity matrix 900 which illustrates how image quality may be improved by analyzing the dissimilarity matrix 900. FIG. 9 is a further example, why the D matrix can be useful, the following FIG. shows results from head imaging where the volunteer coughed slightly during the scan. The left image shows the D matrix which was analyzed in real-time to reacquire disturbed data (in this case shots number 1-number 4, labeled 902). The central and right images show the reconstructed image without and with using reacquired data, respectively. Reacquisition improves image quality considerably by reducing ghosting artifacts.

Figure 10:
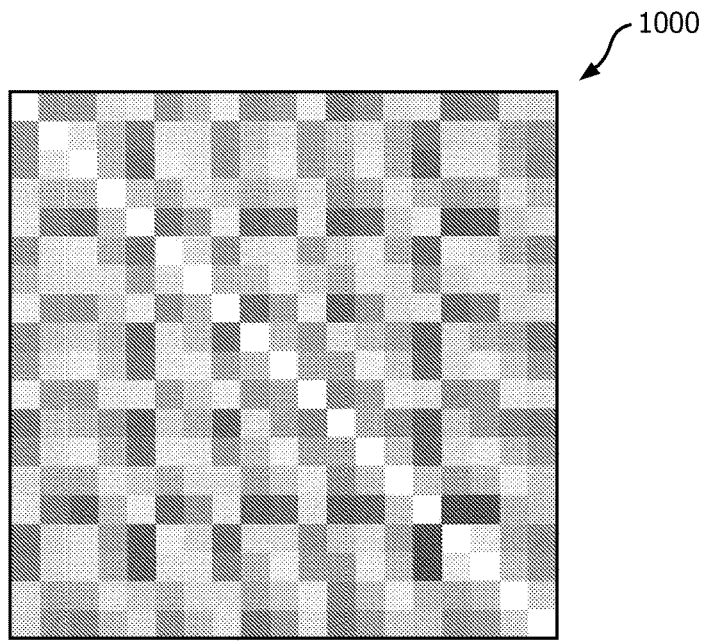
FIG. 10 shows a further visualization of a dissimilarity matrix.
Figure 11:
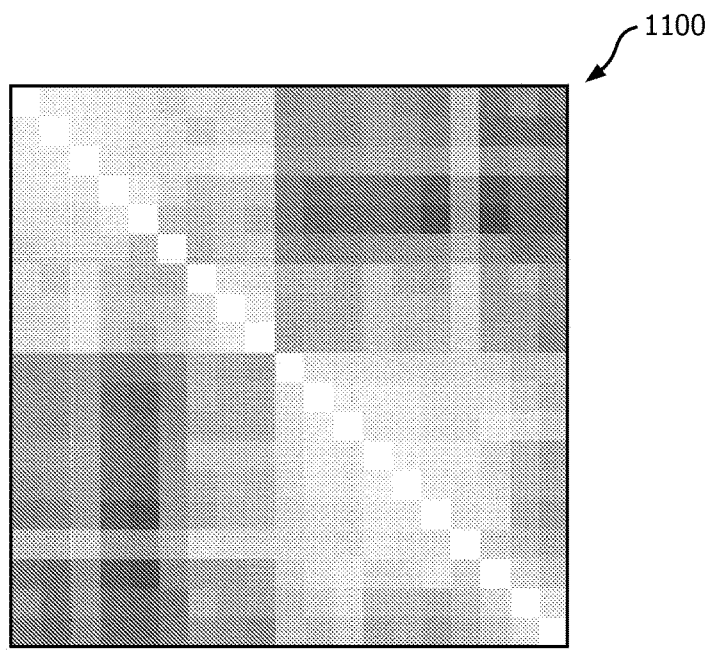
FIG. 11 shows a visualization of the matrix of FIG. 10 after reordering.

The following figures illustrate the application of cluster analysis to embodiments of the invention. FIGS. 10 and 11 show visualizations of a D-matrix 1000, 1100.

FIG. 10 shows an example of a D-matrix 1000 for an experiment consisting of 19 TSE shots. The fluctuation of the dissimilarity values is not random but there seems to be a checkerboard-like pattern. This becomes apparent if the TSE shots are grouped into clusters and the rows and columns of the D-matrix are reordered according to the order created by the clustering process.

The reordered D-matrix 1100 is shown in FIG. 11. From the reordered matrix it is obvious that the data set can be split into two distinct groups.

In this example, the "agglomerative hierarchical clustering algorithm with average linkage" was used. This is an algorithm which creates a hierarchical sequence of clusters from a finite set of n elements: The algorithm is initialized by creating n clusters containing only 1 element each. Then in each step the two clusters which have the smallest dissimilarity are merged. The value of dissimilarity at which the two clusters are merged is stored by the algorithm (called fusion threshold in the following). Since always the clusters with the lowest dissimilarity are merged, the fusion threshold decreases monotonically with the number of clusters. After n steps the algorithm terminates because all clusters have been merged into one cluster containing the entire set.

A more detailed analysis of the clustering process can be used to characterize the data set. This will be discussed in the following using a few examples. The fusion threshold is a measure for the average dissimilarity of all elements within a cluster which is considered still tolerable. Which threshold is rated as tolerable can either be determined by special domain knowledge, i.e. observed distributions of D-matrix values from previous experiments or models of the underlying process (MR signal strength, noise . . . ). Yet a different alternative, which is independent from an absolute threshold value, is to look at the fusion threshold in dependence of the number of clusters. It is expected that the optimal number of clusters is indicated by a 'kink' in the graph.

Figure 12:
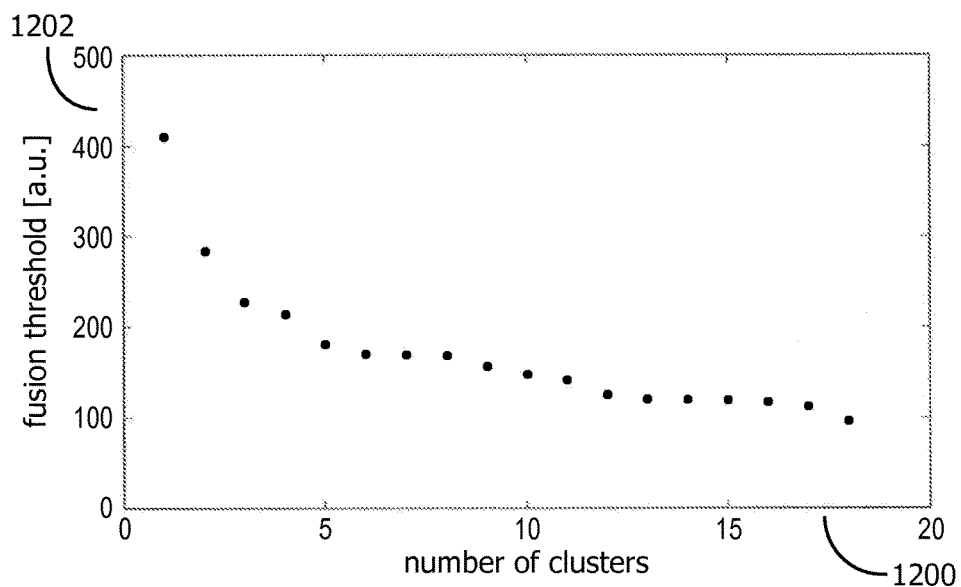
FIG. 12 shows a plot of the number of clusters 1200 versus the fusion threshold 1202 for the example shown in FIGS. 10 and 11.
Figure 13:
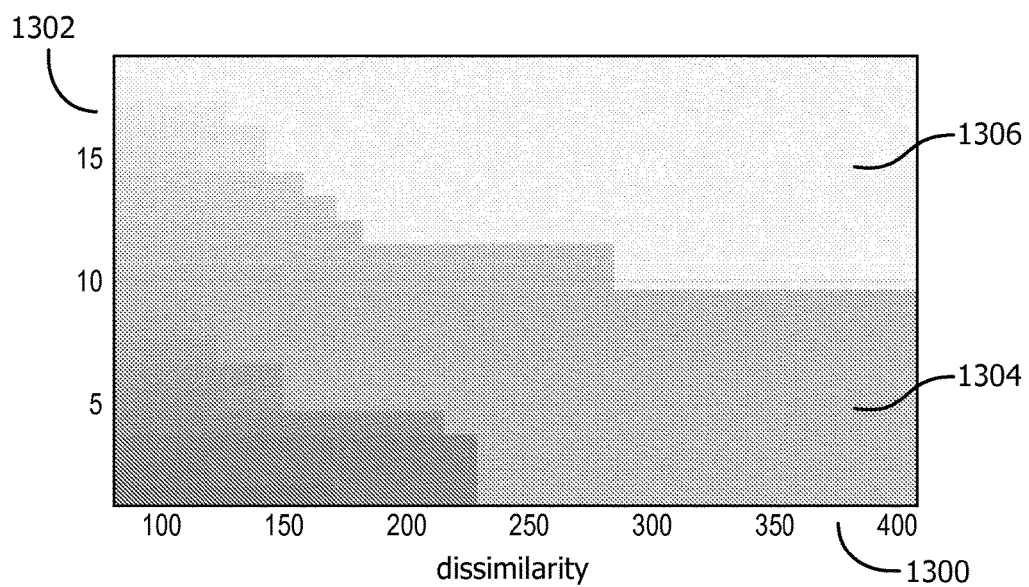
FIG. 13 plots the cluster size distribution depending on the dissimilarity level for the examples shown in FIGS. 10 and 11.

FIG. 12 shows a plot of the number of clusters 1200 versus the fusion threshold 1202 for the example shown in FIGS. 10 and 11. From this it is evident that there is a large drop (410->280) in the fusion threshold in going from one to two clusters. Going from two to three the threshold drops from 280->220. After that there is a gradual decline of the threshold. It can be argued if the optimal number of clusters is 2 or 3. More insight into how to resolve this question can be gained by a different visualization of the clustering process, which contains more information:

FIG. 13 plots the cluster size 1302 distribution depending on the dissimilarity level 1300. FIG. 13 shows which distribution of cluster sizes is present at different levels of inter-cluster dissimilarity. On the horizontal axis 1300 the value of the dissimilarity is shown. One unit on the vertical axis 1302 corresponds to one element of the set. Elements belonging to one cluster are shown in the same grey scale. One can find the distribution of cluster sizes at a certain dissimilarity level by drawing a vertical line at the respective level. The number of clusters present is given by the number of different grey scales under the line. The size of each cluster is the length of the intersection of the line with a grey scale.

For example, at a dissimilarity level of 400 there are only two clusters present. The first cluster 1304 contains 9 elements, the second cluster 1306 contains 10 elements.

If the dissimilarity threshold is lowered the first change occurs at a level of 280: Here the second cluster is split into two subgroups, one containing 2 the other containing 8 elements.

In this context, the purpose of the cluster analysis is to improve the quality of an MR data set by reacquiring data which are disturbed by motion. I.e., one has to make a tradeoff between additional imaging time and potential improvement of quality.

From FIG. 13 one can tell that the dissimilarity of the whole data set can be reduced from 400 to 280 if all elements of the first cluster are reacquired (and the reacquired data belong to the second cluster). Further reduction of the dissimilarity is possible by reacquiring the 2 elements of the smaller sub-group of the second cluster. This means, the hierarchy of clusters can be used to predict how much improvement can be expected with how much extra scan time. I.e., the real question is not where to put the threshold for the clustering but how much extra time can be spent for a certain quality improvement. This is a decision about the tradeoff between speed and quality which will be taken by the operator of the MR system via the user interface of the scanner.

The prediction of the potential improvement cannot be made from FIG. 13 alone because important information is lost in this visualization: the temporal ordering of the elements.

Figure 14:
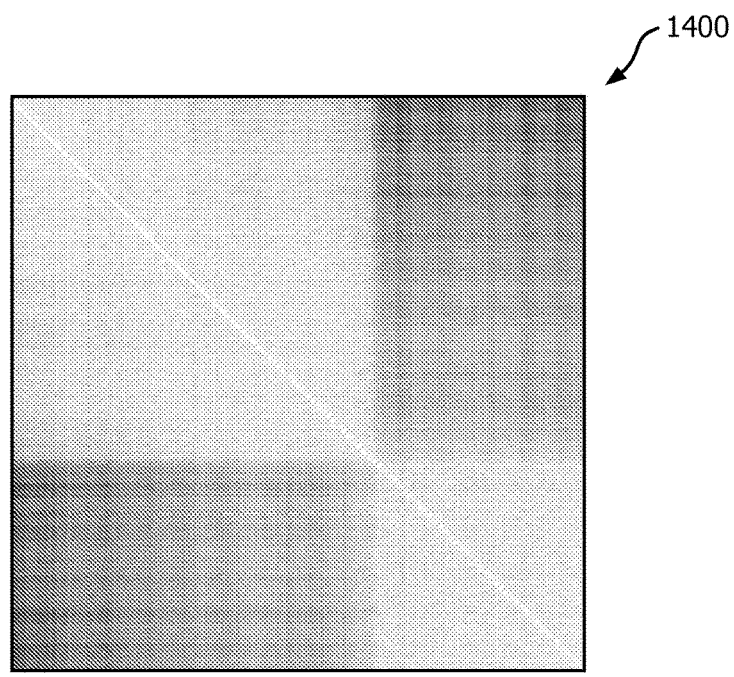
FIG. 14 shows a further visualization of a dissimilarity matrix.
Figure 15:
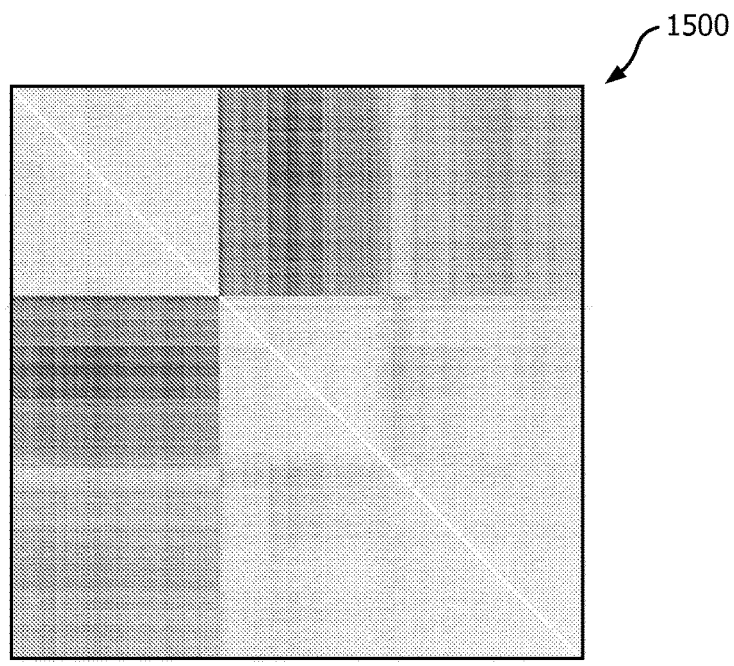
FIG. 15 shows a further visualization of a dissimilarity matrix.

FIGS. 14 and 15 show further visualizations of D matrices 1400, 1500. These figures shows the observed D matrix 1400 and the result 1500 after reordering (There are more rows and columns in this example compared to the previous one because in this experiment a different sequence was used which was divided into many more TSE shots.)

Figure 16:
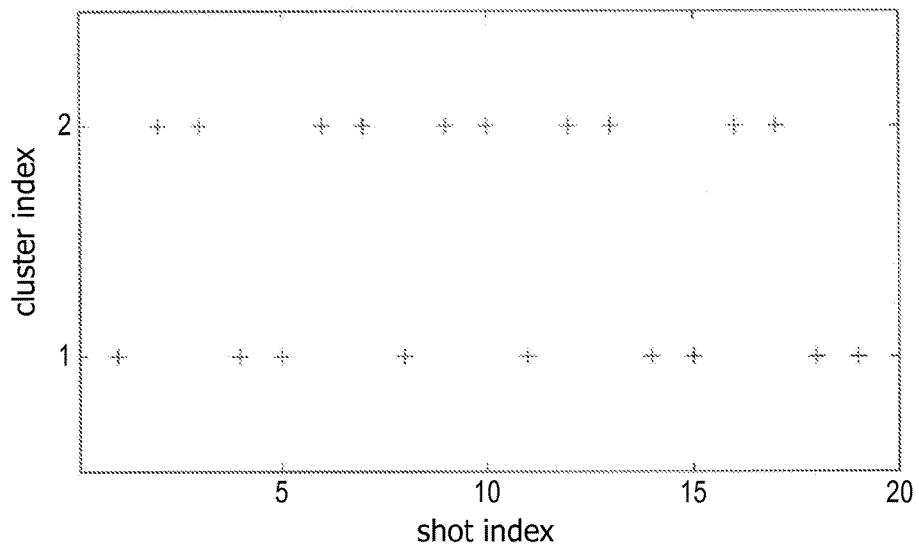
FIG. 16 shows the cluster indices for the different TSE shots for the dissimilarity matrix shown in FIG. 14.

In this example, the data set also can be split into two groups of roughly equal size. But in this case the elements belonging to the two clusters are consecutive in time whereas in the first example they are not. FIG. 16 shows the cluster indices for the different TSE shots for the D matrix shown in FIG. 14 where the indices oscillate between both clusters. This pattern is characteristic for a periodic motion between two states.

Figure 17:
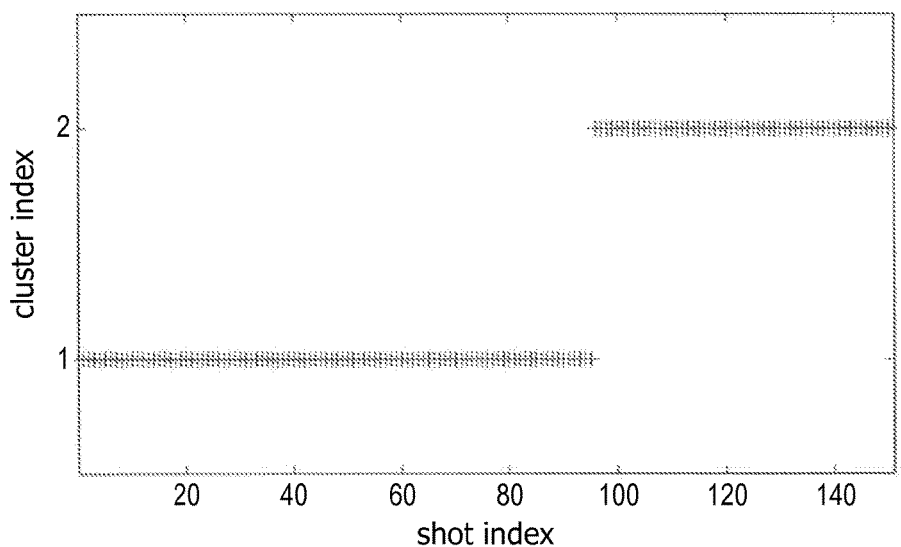
FIG. 17 shows the cluster indices for the different TSE shots for the dissimilarity matrix shown in FIG. 15.

FIG. 17 shows the cluster indices for the different TSE shots for the D matrix shown in FIG. 15. The pattern in FIG. 17 is very different from the pattern in FIG. 16: the first part of the scan belongs to one cluster, the second part to another. This is characteristic of an irreversible change during the scan. If it is decided to eliminate the elements of cluster 2 by reacquisition there is no hope of success because in this case it is very unlikely that the patient will return to the first motion state.

This qualitative discussion can be made more quantitative by calculating the probability that the motion state will change from one state to another.

Figure 18:
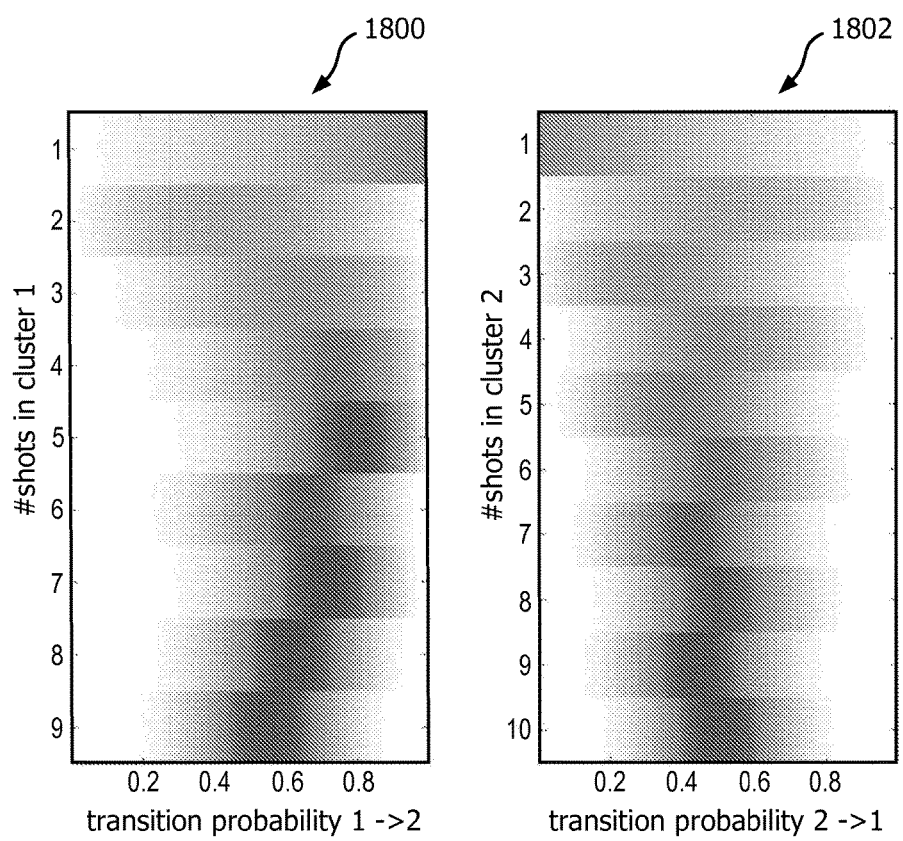
FIG. 18 shows the evolution of the transition probability distributions (PDF) during the experiment for the examples shown in FIGS. 14 and 15.

FIG. 18 shows the evolution of the transition probability distributions (PDF) during the experiment. The left image 1800 shows the probability for a transition from state 1 to state 2, the right image 1802 shows the probability for a transition from state 2 to state 1. Each horizontal line in an image shows the probability density function for a state transition in a gray-scale coding (white represents 0). These probability distributions evolve because every time the patient is in a particular motion state at a certain time point i, the observation whether he is still in the same motion state at time-point i+1 can be used to update the probability distribution function. I.e. the number of lines in each image is given by the number of times the patient was observed in the respective motion state (left: 1, right: 2). This means the last line in each image represents the state of knowledge about the probability of state transitions at the end of the experiment.

Figure 19:
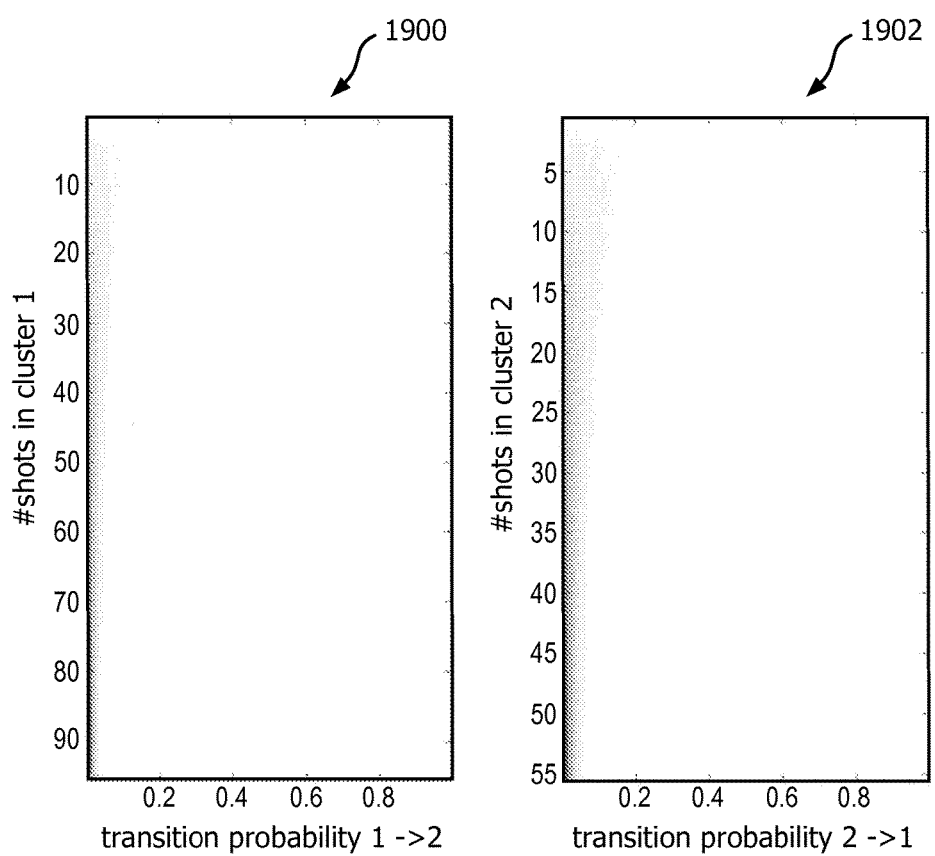
FIG. 19 illustrates the evolution of the knowledge about the transition probability between the two observed motion states in the two examples shown in FIG. 18.

FIG. 19 on the left shows the situation for the first example where repeated state transitions occur during the experiment. As a consequence, the probability for further state transitions is estimated to be approximately 50%. I.e. in this case trying to replace data from cluster 1 by data from cluster 2 using reacquisitions can be successful.

In contrast, FIG. 19 on the right shows the same for the second example where only one state transition at ~60% of the measurement time took place. Here both PDFs at the end of the experiment show that state transitions are highly unlikely. I.e. trying to replace data from cluster 2 by reacquisitions is not going to be successful. In this case a different strategy is required: E.g. readjust the scan geometry to recover the position of the patient in state 1 or abort the scan or notify the user. This is just one example how clustering can help to make a decision to resolve motion related quality problems.

FIG. 19 illustrates the evolution of the knowledge about the transition probability between the two observed motion states in the two examples shown in FIG. 18. The bottom line in each image represents the state of knowledge at the end of the experiment.

Left FIG. 1900: Data for the first example. Here, the PDF is fairly broad and centered at about 50% at the end of the experiment indicating that there is a fair chance that the patient will change between motion states in the future.

Right FIG. 1902: Data for the second example. Because only one state transition is observed during the whole experiment both PDFs quickly evolve into a narrow distribution at low probability values.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 200 magnetic resonance imaging system
204 magnet
206 bore of magnet
208 imaging zone
210 magnetic field gradient coils
212 magnetic field gradient coil power supply
214 radio-frequency coil
216 transceiver
218 subject
220 subject support
226 computer system
228 hardware interface
230 processor
232 user interface
236 computer storage
238 computer memory
240 pulse sequence
242 magnetic resonance data
244 navigator data
246 dissimilarity matrix
248 matrix classification
250 control module
252 navigator data extraction module
254 dissimilarity matrix generation module
256 matrix classification module
300 magnetic resonance imaging system
302 motion detection system
304 first region of interest
306 second region of interest
310 matrix library
312 modification instruction
314 motion data
400 dissimilarity matrix
402 shot number
404 shot number
406 shot 5
700 dissimilarity matrix 702 shot 95
800 dissimilarity matrix
802 shot 130
804 shots 170 to 180
900 dissimilarity matrix
902 shots 1 to 4
1000 dissimilarity matrix
1100 dissimilarity matrix
1200 number of clusters
1202 fusion threshold
1300 dissimilarity
1302 fusion threshold
1400 dissimilarity matrix
1500 dissimilarity matrix
1800 left image
1802 right image
1900 left image
1902 right image

The invention claimed is:

1. A magnetic resonance imaging system for acquiring magnetic resonance data from an imaging zone, wherein the magnetic resonance imaging system comprises:
   one or more computer processors configured for controlling the magnetic resonance imaging system to image a patient in an imaging zone of the magnetic resonance imaging system, the patient undergoing patient motion; and
   a memory configured for storing machine executable instructions for execution by the processor, wherein execution of the machine executable instructions causes the one or more processors to:
      control the magnetic resonance imaging system to repeatedly acquire the magnetic resonance data from the imaging zone, the magnetic resonance data including magnetic resonance anatomic image data and magnetic resonance navigator data;
      create a set of navigator vectors from the magnetic resonance navigator data;
      construct a dissimilarity matrix by calculating a metric indicative of a dissimilarity between each navigator vector of the set of navigator vectors;
      determine a matrix classification of the dissimilarity matrix using a classification algorithm, the matrix classification being indicative of patient motion;
      control the magnetic resonance imaging system to modify acquisition of the magnetic resonance data based on the determined matrix classification; and
      reconstruct the magnetic resonance anatomic image data into at least one anatomic image; and
   a display device configured to display the at least one anatomic image.

2. The magnetic resonance imaging system of claim 1, wherein the classification algorithm is a pattern recognition algorithm operable for selecting the matrix classification.

3. The magnetic resonance imaging system of claim 2, wherein the memory further comprises a matrix library comprising example dissimilarities matrices, wherein the pattern recognition module is configured to determine the matrix classification based on determining similarity of the constructed dissimilarity matrix to one of the example dissimilarity matrices.

4. The magnetic resonance imaging system of claim 3, wherein each of the example dissimilarity matrices is associated with corresponding instructions for modifying the acquisition of the magnetic resonance data by the magnetic resonance imaging system.

5. The magnetic resonance imaging system of claim 2, wherein the pattern recognition algorithm includes a cluster analysis algorithm, wherein the cluster analysis algorithm performs a temporal correlation of the set of navigator vectors.

6. The magnetic resonance imaging system of claim 1, wherein the classification algorithm includes one of the following: performing a Bayesian analysis, thresholding the dissimilarity matrix, calculating a standard deviation of the dissimilarity matrix, identifying elements of the dissimilarity matrix outside of a predetermined range, and performing a probability based selection.

7. The magnetic resonance imaging system of claim 1, wherein the magnetic resonance data comprises multiple slices, wherein execution of the instructions further causes the one or more processors to:
   calculate the dissimilarity matrix for each of the multiple slices to generate a plurality of dissimilarity matrices;
   generate a set of matrix classifications by using the classification algorithm to generate the dissimilarity classification for each dissimilarity matrix of the set of dissimilarity matrices; and
   control the magnetic resonance imaging system to modify acquisition of the magnetic resonance data using the set of matrix classifications.

8. The magnetic resonance imaging system of claim 1, wherein the magnetic resonance imaging system further comprises a multi-channel radio frequency system configured for receiving the magnetic resonance imaging data from more than one channel simultaneously, wherein execution of the instructions further causes the one or more processors to create the set of navigator vectors by combining the navigator data from the more than one channel using any one of the following: averaging the navigator data from the more than one channel using a predetermined weighting and concatenating the navigator data from the more than one channel.

9. The magnetic resonance imaging system of claim 1, wherein the metric indicative of the dissimilarity is determined by one of the following: computing the sum of the squared complex difference between navigator vectors, calculating the difference in the magnitude of the navigator vectors, calculating the absolute value of the difference between navigator vectors, and calculating the correlation between navigator signals.

10. The magnetic resonance imaging system of claim 9, wherein execution of the instructions causes the magnetic resonance imaging system to acquire the anatomic image data from a first region of interest and acquire the navigator data from a second region of interest.

11. The magnetic resonance imaging system of claim 10, wherein the magnetic resonance imaging system further comprises a non-magnetic resonance motion detection system configured to acquire motion data from the non-magnetic resonance motion detection system wherein execution of the instructions causes the one or more processors to acquire the motion data during the acquisition of the magnetic resonance data, wherein execution of the instructions further cause the one or more processors to incorporate the non-magnetic resonance motion data into the dissimilarity matrix.

12. The magnetic resonance imaging system of claim 1, wherein the acquiring of magnetic resonance data is modified by one of the following: stopping the acquiring of magnetic resonance data, modifying the scan geometry and re-starting the acquiring of magnetic resonance data, ignoring one or more portions of the magnetic resonance data, reacquiring the portion of the magnetic resonance data, generating an operator alert, and combinations thereof.

13. A non-transitory computer readable medium carrying machine readable instructions which when executed by a processor controls a magnetic resonance imaging system to acquire magnetic resonance data from an imaging zone by repeatedly:
   controlling the magnetic resonance imaging system to acquire magnetic resonance data from a patient who undergoes patient motion, wherein the magnetic resonance data includes navigator data and image data and assemble the navigator data into a set of navigator vectors;
   construct a dissimilarity matrix by calculating a metric indicative of a dissimilarity between each navigator vector of the set of navigator vectors;
   determine for the dissimilarity matrix a matrix classification indicative of the patient motion;
   control the magnetic resonance imaging system to modify acquisition of the magnetic resonance data using the matrix classification;
   reconstruct the image data into at least one anatomic image; and
   control a display device to display the at least one anatomic image.

14. A magnetic resonance system comprising:
   one or more computer processors configured to:
      control a magnetic resonance imaging system to generate magnetic resonance data including imaging data and navigator data from a patient who undergoes patient motion;
      receive the magnetic resonance data including the imaging data and the navigator data;
      extract the navigator data from the magnetic resonance data from the extracted navigator data, create a set of navigator vectors;
      determine a metric indicative of dissimilarities between each of the navigator vectors of the set of navigator vectors;
      construct a dissimilarity matrix from the determined metrics of the set of navigator vectors;
      determine a matrix classification for the dissimilarity matrix based on pattern recognition, the matrix classification being indicative of the patient motion which the patient is undergoing;
      modify the controlling of the magnetic resonance imaging system based on the determined matrix classification; and
      reconstruct the acquired magnetic resonance image data into an image, the image being a visualization.

15. The magnetic resonance imaging apparatus according to claim 14, further including:
   a display device configured to display the image.

16. The magnetic resonance imaging according to claim 15, wherein the imaging data is anatomical data and the image is an anatomical image.

17. The magnetic resonance imaging system of claim 14, wherein the magnetic resonance imaging system includes:
   a main magnet configured to generate a magnetic field through a patient to be imaged;
   magnetic field gradient coils configured to spatially encode magnetic spins in the patient;
   a radiofrequency coil configured to receive radiofrequency signals from the spatially encoded magnetic spins and generate corresponding magnetic resonance data.

18. A magnetic resonance imaging method comprising:
   controlling a magnetic resonance imaging system to generate magnetic resonance data from a patient undergoing motion, the magnetic resonance data including imaging data and navigator data;
   receiving the magnetic resonance data with one or more processors;
   from the navigator data, creating a set of navigator vectors with the one or more processors;
   determining a metric indicative of dissimilarities between each of the navigator vectors of the set of navigator vectors with the one or more processors;
   constructing a dissimilarity matrix from the determined metrics with the one or more processors;
   determining a matrix classification for the dissimilarity matrix, the matrix classification being indicative of the motion which the patient is undergoing with the one or more processors;
   modifying the controlling of the magnetic resonance imaging system based on the determined matrix classification with the one or more processors;
   reconstruct the acquired magnetic resonance data into a magnetic resonance image with the one or more processors; and
   control a display device to display the magnetic resonance image.

19. The magnetic resonance imaging method according to claim 18, wherein the magnetic resonance image is an anatomical image.

* * * * *